United States Patent [19]

Feigelson et al.

[11] Patent Number: 4,465,545
[45] Date of Patent: Aug. 14, 1984

[54] METHOD OF GROWING SINGLE CRYSTAL CADMIUM TELLURIDE

[75] Inventors: Robert S. Feigelson, Saratoga; Alexander Borshchevsky, Palo Alto, both of Calif.

[73] Assignee: The Board of Trustees of the Leland Stanford Junior University, Palo Alto, Calif.

[21] Appl. No.: 403,554

[22] Filed: Jul. 30, 1982

[51] Int. Cl.³ .................................................. C30B 7/06
[52] U.S. Cl. ......................... 156/616 R; 156/DIG. 72
[58] Field of Search ................... 156/616 R, DIG. 72; 148/1.5, 171, 172

[56] References Cited

U.S. PATENT DOCUMENTS

| 2,835,614 | 5/1958 | Pohl | 156/616 |
| 3,620,686 | 11/1971 | Pfann | 156/616 |
| 4,190,486 | 2/1980 | Kyle | 156/DIG. 72 |

FOREIGN PATENT DOCUMENTS

| 49-35279 | 4/1974 | Japan | 156/616 R |
| 1129789 | 10/1968 | United Kingdom | 156/DIG. 72 |

Primary Examiner—Hiram H. Bernstein
Attorney, Agent, or Firm—Flehr, Hohbach, Test, Albritton & Herbert

[57] ABSTRACT

The crystalline structure of cadmium telluride grown in a Bridgman process is enhanced by applying vibrations at a frequency less than 1000 hertz at a low amplitude whereby the cadmium telluride has vibrations with a displacement of less than one-tenth millimeter.

5 Claims, 1 Drawing Figure

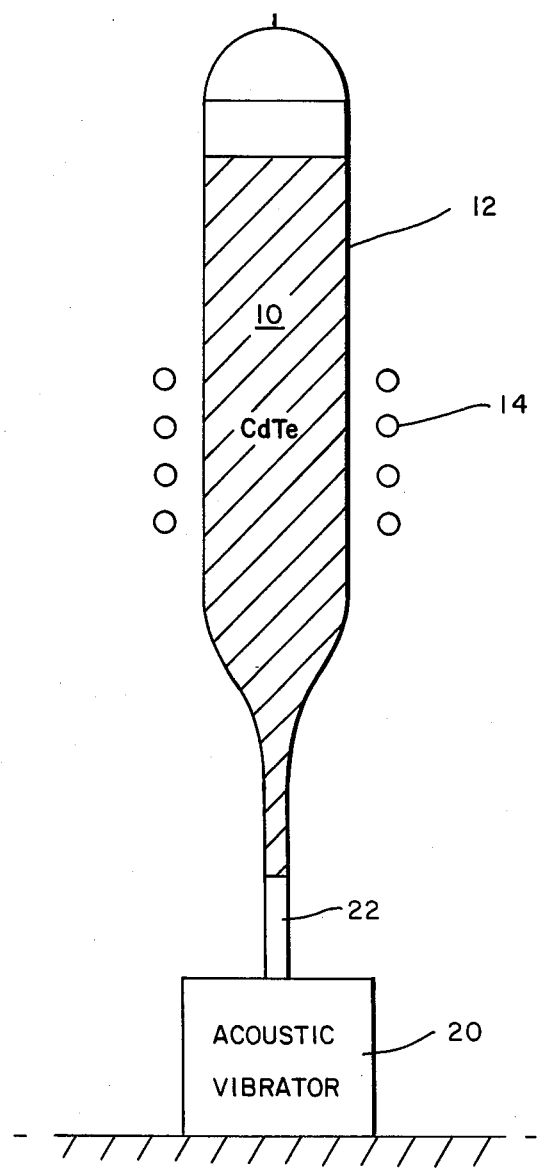

METHOD OF GROWING SINGLE CRYSTAL CADMIUM TELLURIDE

The U.S. government has rights in the subject patent application under Contract No. DMR 77-24222.

This invention relates generally to crystal growing technology, and more particularly the invention relates to growing cadmium telluride (CdTe) crystals.

Techniques are well known for the growing of crystalline ingots. Two basic melt-growth techniques are the Bridgman and the Czochralski methods. The Czochralski technique involves controlled crystallization from a melt in a crucible by slowly pulling the crystal upwards as it grows. In the Bridgman method the melt is progressively frozen from one end to the other. Both processes have been used successfully in growing single crystalline semiconductor materials such as silicon and gallium arsenide for integrated circuit applications. However, the Bridgman technique is more economical since the apparatus is simple and inexpensive, and the process requires less operator attention.

Cadmium telluride has become an increasingly important material for use as heterojunction substrates in photovoltaic cells and for use in heat sensing devices and IR detectors. Although CdTe can be grown in bulk, the crystals typically have many grains, twins and high dislocation densities, and are not as high in quality as is desired.

Attempts have been made at improving the crystalline structure of CdTe. For example, Woodbury and Lewandowski in "Improved Sealed Ingot Zoning Refining Technique for Growth of CdTe Crystals", Journal of Crystal Growth, 10, (1971) pages 6–12 discuss a zone leveling technique in which linear oscillations are imparted to the CdTe container. Woodbury and Lewandowski discovered that large vertical oscillations of the ingot during the last zone path greatly enhanced the growth of large single crystals. Typical oscillations ranged from two millimeters peak to peak motion at 200 cpm to five millimeters peak to peak motion at 17 cpm. However, Woodbury and Lewandowski concluded that frequencies up to 900 cpm with much lower amplitude would not work, and they ruled out vibration effects or agitations of the ingot as important. According to their findings, a large amplitude motion at a high enough frequency to keep the ingot from cycling in temperature was necessary to improve crystalline structure.

The use of low frequency vibrations during the melt growth of single crystals using the Czochralski method is known. When used with the Czochralski method some reduction in dislocation densities in polycrystalline ingots has been achieved. However, in most crystal growth situations mechanical disturbances are considered to be detrimental and are usually minimized. Studies are known in which the effects of ultrasonic vibrations have been imparted during the crystal growth. The results in using low frequency vibrations on the Czochralski growth of indium-antimonide have provided information regarding the incorporation, distribution of impurities during crystal growth, and the formation of crystal defects, orientation defects, and other aspects of the solidification process in general. Reductions in the dislocation density up to tenfold was reported with increasing 100 hertz acoustic energy until a minimum density was reached. Higher vibrational amplitudes caused increasing dislocation densities. In other reported work 100 hertz vibrations were introduced into crystallizing melts of various semiconductors, and with certain combinations of cooling rates and vibrational amplitude single crystalline growth was realized.

An object of the present invention is an improved method of growing single crystal cadmium telluride.

Another object of the invention is a method of improving the crystalline structure of cadmium telluride which is readily implemented with conventional Bridgman process apparatus.

A feature of the invention is the use of low amplitude and low frequency acoustic vibrations to the liquid-solid interface during crystal growth in a Bridgman process.

The invention and objects and features thereof will be more readily apparent from the following detailed description and appended claims when taken with the drawing which is a section view of apparatus for carrying out the invention.

Referring now to the drawing, apparatus for carrying out a conventional Bridgman process includes a material 10 sealed within a quartz container 12 and positioned within the heater 14 of a furnace. The heater heats the CdTe material above its melting temperature (1092° C. for CdTe) and the quartz container 10 is then moved through the furnace (or the furnace moved with the container fixed) at a rate of approximately 2 centimeters per day. In one embodiment the quartz container has a diameter of 20 millimeters and a length of 250 millimeters.

In accordance with the invention an acoustic vibrator 20 is coupled to the tube 12 by means of a rod 22. As the tube 12 is moved through the furnace 14, low frequency vibrations (e.g. less than 1,000 hertz) are translated to the melt. It has been found that by limiting the vertical displacement of the melt to less than one-half millimeter at the low acoustic frequency, a single crystal boule having a reduced dislocation density is grown.

In one embodiment a 60 hertz vibration was applied to the quartz tube with a 0.025 millimeter displacement of the melt. Specimens were obtained from the boule by cutting wafers with a surface within a few degrees of the (111) orientation. The surfaces were then lapped and polished to remove residual damage resulting from the slicing operation. Typical wafers were on the order of 40–60 mils thick with some of the larger wafers being slightly larger than 1 square centimeter in area.

By conventional testing, etch pits were formed by immersing the wafers in a $AgNO_3:HF:CrO_3$ solution and were compared with etch pits formed on similarly oriented CdTe wafers purchased from a commercial supplier. The wafers made in accordance with the invention showed typical etch pit density (EPD) of approximately $10^3$ per square centimeter located around the wafer edge. The EPDs at the center of the wafers were typically less than 10 per square centimeter. By contrast, the commercially purchased CdTe wafers had randomly distributed EPD of $10^4$–$10^5$ per square centimeter, which is considered to be the highest quality commercially available CdTe.

Surface room temperature photovoltaic measurements made on the wafers produced in accordance with this invention indicates that the crystal had an electron diffusion length of approximately 3 microns. The commercial CdTe wafers exhibited diffusion lengths of approximately 1–1.5 microns.

Thus, based on the etch pit density the wafers cut from the boule of CdTe made in accordance with the invention prove to be substantially superior in quality as compared to the commercially available CdTe samples. The diffusion lengths measurements also indicated that wafers cut from the boule of CdTe made in accordance with the invention were superior to the purchased CdTe wafers.

By applying low frequency acoustic waves and limiting the physical displacement of the melt while growing the boule of CdTe in a conventional Bridgman process, improved crystalline structure has been demonstrated. While the invention has been described with reference to specific embodiments, the description is illustrative of the invention and is not to be construed as limiting the invention. Various modifications and applications may occur to those skilled in the art without departing from the true spirit and scope of the invention as defined by the appended claims.

What is claimed is:

1. A method of enhancing the crystalline structure of cadmium telluride grown by a Bridgman process comprising the step of applying low amplitude vibrations at a frequency of less than 1000 hertz to the cadmium telluride as it is grown with vibratory displacement of the cadmium telluride being less than one-half of a millimeter.

2. A method of growing single crystal cadmium telluride comprising the steps of:
   providing a mass of cadmium telluride in a sealed container,
   heating said cadmium telluride to a sufficient temperature to melt said mass,
   applying low amplitude vibrations at a frequency of less than 1000 hertz to said cadmium telluride whereby said low amplitude vibrations move said cadmium telluride less than one-half of a millimeter, and
   establishing relative motion between said sealed container and said furnace whereby all of said cadmium telluride is unidirectionally recrystallied.

3. The method as defined in claim 2 wherein said frequency is on the order of 60 hertz and said cadmium telluride is moved on the order of 0.025 millimeter.

4. The method as defined by claim 2 wherein said step of establishing relative motion includes maintaining said sealed container stationary and slowly moving said furnace.

5. The method as defined by claim 2 wherein said step of establishing relative motion includes maintaining said furnace stationary and slowly moving said sealed container.

* * * * *